United States Patent
Kuibira et al.

(10) Patent No.: US 7,394,043 B2
(45) Date of Patent: *Jul. 1, 2008

(54) CERAMIC SUSCEPTOR

(75) Inventors: Akira Kuibira, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/160,825

(22) Filed: Jul. 12, 2005

(65) Prior Publication Data

US 2005/0242078 A1    Nov. 3, 2005

Related U.S. Application Data

(63) Continuation-in-part of application No. 10/711,064, filed on Aug. 20, 2004, now Pat. No. 6,946,625.

(51) Int. Cl.
*H05B 3/68* (2006.01)

(52) U.S. Cl. .................................. 219/444.1; 118/725

(58) Field of Classification Search ............. 219/443.1, 219/444.1, 543, 544, 546, 547, 548; 118/724, 118/725; 427/587, 588, 589, 592, 593
See application file for complete search history.

(56) References Cited

U.S. PATENT DOCUMENTS 6,946,625 B2 * 9/2005 Kuibira et al. ........... 219/444.1

FOREIGN PATENT DOCUMENTS

| JP | H10-189225 A | 7/1998 |
| JP | H11-074064 A | 3/1999 |
| JP | H11-273839 A | 10/1999 |
| JP | 2000-164336 A | 6/2000 |

\* cited by examiner

*Primary Examiner*—Sang Y. Paik
(74) *Attorney, Agent, or Firm*—James W. Judge

(57) ABSTRACT

Ceramic susceptor whose wafer-retaining face has superior isothermal properties, and that is suited to utilization in apparatuses for manufacturing semiconductors and in liquid-crystal manufacturing apparatuses. In plate-shaped sintered ceramic body 1, resistive heating element 2 is formed. Fluctuation in pullback length L between sintered ceramic body outer-peripheral edge 1a and resistive heating element substantive-domain outer-peripheral edge 2a is within ±0.8%, while isothermal rating of the entire surface of the wafer-retaining face is ±1.0% or less. Preferable is a superior isothermal rating of ±0.5% or less that can be achieved by bringing the fluctuation in pullback length L to within ±0.5%.

8 Claims, 1 Drawing Sheet

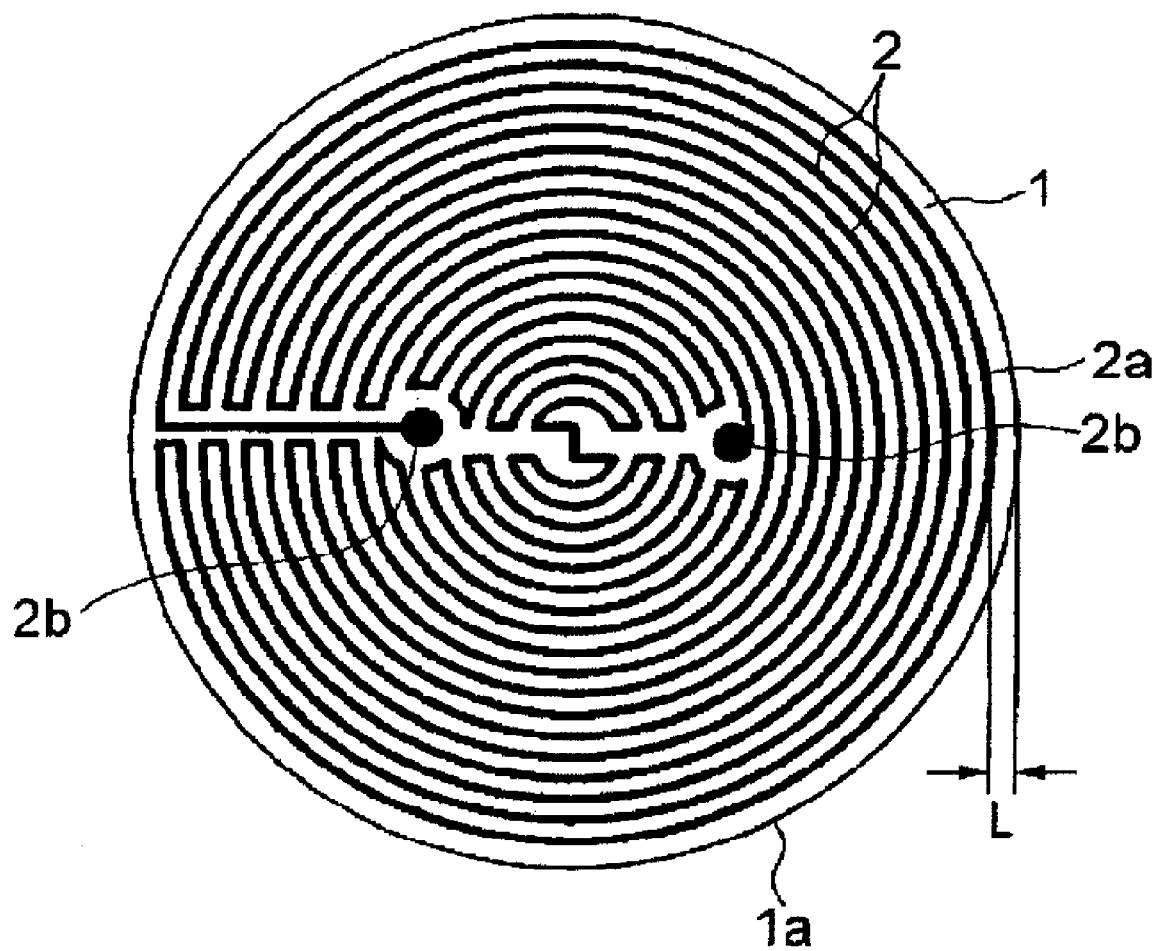

CERAMIC SUSCEPTOR

FIELD OF THE INVENTION

The present invention relates to heaters in ceramics, and relates in particular to heaters in ceramic susceptors employed in CVD devices, plasma CVD devices, etching devices, and plasma etching devices for manufacturing semiconductors, and in liquid-crystal manufacturing apparatuses.

BACKGROUND ART

In order for the film-formation rates or etching rates in CVD (chemical vapor deposition), plasma CVD, etching, or plasma etching on a semiconductor wafer retained in a film-deposition chamber to take place uniformly, the wafer surface temperature must be strictly controlled. For the purpose of such temperature control, a heater is built into a wafer-retaining member, the surface of the wafer-retaining member is heated, and a wafer of semiconductor material is heated by thermal transfer. Ceramics endowed with heat-resistant, corrosion resistant and insulative properties, such as aluminum nitride and silicon nitride, have been employed to date as wafer retaining members of this sort.

A wafer retaining member made of ceramic into which the foregoing heater is built then has been manufactured according to a method that amounts to sintering aluminum nitride and building-in a molybdenum coil, by training a molybdenum coil into a groove formed in for example a disk-shaped aluminum nitride plate, sandwiching it with another such aluminum nitride plate, and hot-press sintering the sandwich.

In a wafer retaining member made of ceramic into which a heater is built, i.e., a ceramic susceptor, the constituent components of the heater resistive heating element are regarded as elemental impurities, even in trace amounts, with respect to a semiconductor material for silicon wafers or the like, or a liquid crystal material, and can become the source of malfunctioning in semiconductor chips and liquid crystals.

Given the impurity threat, either a resistive heating element must be completely embedded into a ceramic susceptor so as not to appear on the surface, or else a resistive heating element formed superficially on a ceramic must be coated with a protective layer, within the chamber of semiconductor manufacturing apparatuses. Consequently, an area in which the heating element is not buried, i.e., a non-heating area, will necessarily be present on the outer peripheral portion of the ceramic susceptor. The heat generated by the resistive heating element is transmitted through the ceramic, reaching the surface, and from the surface then radiates or escapes via gases due to heat transfer. This means that in disk-shaped or rectangular plate-shaped ceramic susceptors the outer peripheral margin is therefore the place where heat is most liable to escape.

Owing to the above-noted two causative factors taken together, the outer periphery of a ceramic susceptor is the portion where temperature is most prone to drop. To address this issue, elimination of difference in temperature by using for the ceramic a material whose thermal conductivity is high, to swiftly diffuse toward the outer periphery the heat generated by the resistive heating element, has been practiced. Likewise another expedient has been to try to eliminate the temperature difference by increasing the winding density of the coil and the pattern density of the resistive heating element the more toward the outer periphery of the resistive heating element they are, to raise the heating density along, compensating with heat in, the outer periphery.

When a coil trained into an indefinite shape and the outer peripheral edge of the resistive heating element in its substantive domain becomes disrupted. The consequence of this has been that despite a resistive heating element being isothermally designed by strictly reckoning how much heat it puts forth and compensation for heat dispersion to its non-heated portions and for heat escape from its edge portion, in practice, the substantive heat-issuing domain becomes disrupted in the edge portion, which has made it impossible to obtain desired isothermal rating in the surface entirety of the ceramic susceptor.

Meanwhile, with the scaling-up of semiconductor wafer size in recent years, isothermal demands on ceramic susceptors for heating the wafers have become stricter, with an isothermal rating in the wafer-retaining face of at minimum within ±1.0%, preferably within ±0.5% being required.

BRIEF SUMMARY OF THE INVENTION

An object of the present invention, in view of such circumstances to date, is to realize a ceramic susceptor, being a plate-shaped sintered ceramic body into which a coil-shaped resistive heating element is embedded, whose wafer-retaining face excels in isothermal properties over its entire surface.

In order to achieve the foregoing objective, a ceramic susceptor that the present invention realizes, being a resistive heating element formed in a plate-shaped sintered ceramic body, is characterized in that fluctuation in pullback length between the outer peripheral edge of the sintered ceramic body and the outer peripheral edge of the resistive heating element in its substantive domain is within ±0.8% with respect to the outer diameter of the sintered ceramic body. Furthermore, fluctuation in the pullback length is preferably within ±0.5% with respect to the outer diameter of the sintered ceramic body.

A ceramic susceptor by the present invention as noted above may be characterized in that the sintered ceramic body is made of at least one substance type selected from aluminum nitride, silicon nitride, silicon carbide, and aluminum oxide. Furthermore, the resistive heating element may be characterized in being made of at least one metal type selected from W, Mo, Ag, Pt, Pd, Ni and Cr.

As determined by the present invention, in terms of a ceramic susceptor in which a coil-shaped resistive heating element is embedded into a plate-shaped sintered ceramic body, by controlling fluctuation in the pullback length between the outer peripheral edge of the sintered ceramic body and the outer peripheral edge of the resistive heating element in its substantive domain, the isothermal rating over the surface entirety of the wafer-retaining face can be made the ±1.0% or less that has been demanded; more preferably, an isothermal rating that is an outstanding ±0.5% or less can be achieved.

From the following detailed description in conjunction with the accompanying drawings, the foregoing and other objects, features, aspects and advantages of the present invention will become readily apparent to those skilled in the art.

BRIEF DESCRIPTION OF THE SEVERAL VIEWS OF THE DRAWING

The FIGURE is a plan view illustrating an example of a circuit pattern for a resistive heating element.

DETAILED DESCRIPTION OF THE INVENTION

The present inventors discovered as a result of concerted investigations that when forming a resistive heating element in a sintered ceramic body, by getting the fluctuation in pullback length between the sintered member outer peripheral edge and the resistive heating element substantive-domain outer peripheral edge to be essentially within ±0.8% with respect to the outer diameter of the sintered ceramic body, the isothermal rating of the ceramic susceptor over its entire face satisfies the minimal requirement that it be within ±1.0%.

They likewise discovered that by getting the fluctuation in pullback length between the sintered ceramic body outer peripheral edge and the resistive heating element substantive-domain outer peripheral edge to be essentially within ±0.5% with respect to the outer diameter of the sintered ceramic body, the isothermal rating of the ceramic susceptor over its entire face will be the within ±0.5% that has been most desirable.

An example of a resistive heating element embedded in a sintered ceramic body is illustrated in the FIGURE. The resistive heating element 2 that is embedded in the sintered ceramic body 1 is formed into a coil-shaped circuit pattern, and length L between outer-peripheral edge 1a of the sintered ceramic body 1 and resistive heating element substantive-domain outer-peripheral edge 2a of resistive heating element 2 is the pullback length. It will be appreciated that through lead lines from its two circuit ends 2b, 2b the resistive heating element 2 forming the coil shape is rendered externally accessible, wherein supplying electric power from a power source causes it to generate heat. Likewise it should be understood that the circuit pattern shown in the figure for the resistive heating element 2 is a single example, and does not mean that the present invention is thereby limited.

In a situation in which the circuit pattern for the resistive heating element is formed onto a molded ceramic body or a green sheet, sintering the substrate and the circuit pattern proceeds while it is shrunk and made compact. In such cases, shrinking uniformly is extremely difficult owing to non-uniform volatilization of oxides as the sintering promoter, which is due to non-uniformity in the sintering promoter and non-uniform carbon residues after degreasing, and to fluctuations in the furnace internal temperature and atmosphere when sintering, and the conformation of the domain in which the resistive heating element is substantially present is liable to warp. By the same token, hot press sintering a molybdenum coil shaped as a heater, and a molybdenum sheet, placed on a molded ceramic body deforms the outer peripheral edge of the resistive heating element substantive domain because in the hot-press sintering process the coil and the sheet become smashed and crushed or warped or displaced.

Although the outer peripheral edge of the sintered ceramic body can be processed to lend it precision, if the resistive heating element substantive domain deforms, fluctuations will end up occurring in the pullback length between the sintered ceramic body outer peripheral edge and the resistive heating element substantive-domain outer peripheral edge. Strictly controlling these factors so as to achieve uniformity, and getting the fluctuation in pullback length between the ceramic sintered member outer peripheral edge and the resistive heating element substantive-domain outer peripheral edge to be essentially within ±0.8% with respect to the outer diameter of the sintered ceramic body, desirably within ±0.5% with respect to the outer diameter of the sintered ceramic body, yields the superior isothermal properties mentioned above. It should be understood that the pullback length can be appropriately determined according to the wafer or similar target.

As a method for in this way controlling fluctuations in the pullback length to be within a certain range, printing, with a paste in which resistive-heating-element components and a sintering promoter have been mixed and kneaded, a sintered ceramic body—which after having already been sintered will not shrink/deform any further—with a circuit, and subsequently baking the circuit, onto a surface that has been processed to satisfactory precision enables the resistive heating element circuit to be baked without being deformed. By thereafter joining the sintered ceramic body on which the resistive heating element circuit is baked and a sintered ceramic body of identical outside diameter, employing a bonding material, a ceramic susceptor inside of which a resistive heating element is embedded can be readily manufactured. Alternatively, by coating the resistive heating element superficially with a protective layer a ceramic susceptor including a resistive heating element can be readily manufactured.

From the perspectives of corrosion resistance, thermal conductivity, and the like, it is preferable that the ceramic forming the sintered ceramic body be made of one substance type selected from aluminum nitride, silicon nitride, silicon carbide, and aluminum oxide.

Likewise, a metal having corrosion resistance and an inherent resistance value suited to generating heat, preferably at least one metal type selected from W, Mo, Ag, Pt, Pd, Ni and Cr, can be used for the resistive heating element.

EMBODIMENTS

Embodiment 1

A granulated powder was prepared by adding 0.8 weight % yttrium oxide ($Y_2O_3$) as a sintering promoter and polyvinyl alcohol as a binder to aluminum nitride (AlN) powder, dispersing and mixing these ingredients using a ball mill with ethanol as a solvent, and then spray-drying the mixture to granulate it.

After being sintered the granulated powder obtained was molded with a uniaxial press into 2 plates whose dimensions were 355 mm diameter×5 mm thickness. These were degreased within a nitrogen gas stream at a temperature of 800° C. and then sintered at 1850° C. in a nitrogen gas stream, whereby sintered AlN plates were manufactured. The thermal conductivity of the sintered AlN plates was 180 W/mK. Both the top and bottom surfaces of the obtained sintered AlN plates were polished using diamond grit.

Next, a coil-shaped pattern was printed onto one of the sintered AlN plates using a tungsten slurry that was obtained by kneading and mixing tungsten powder to which 1 weight % yttrium and, as a binder, ethyl-cellulose were added. The final pullback length of the outer peripheral edge of the tungsten-pattern and the outer peripheral edge of the sintered AlN plate was set herein to be 5.0 mm. The sintered AlN plate was degreased in a 90° C. nitrogen gas stream, and then baked 2 hours at 1800° C.

Further, ethyl-cellulose was added to, mixed with, and kneaded into a $Y_2O_3$—$Al_2O_3$ bonding material, which mixture was printed as pattern on the one further sintered AlN plate. This was degreased within a 900° C. nitrogen gas stream, and then the tungsten-pattern face and bonding-material face of the two sintered AlN plates were matched and hot-press bonded under 50 g/cm$^2$ at 1750° C. The outer periphery of the joined body was thereafter processed to finish it into a round contour 350 mm in diameter.

Power was supplied through externally accessible lead lines from the circuit ends to the obtained ceramic susceptor, heating the tungsten resistive heating element, and results of measuring the isothermal rating in the wafer-retaining face indicated a satisfactory isothermal rating of 500° C.±0.40%. In this case, the ceramic susceptor was breached along the radial direction and the pullback length between the outer-peripheral edge of the tungsten resistive heating element domain, and the outer peripheral edge of the sintered AlN body, (set value: 5.0 mm) was measured, wherein the fluctuation was ±0.002% with respect to the diameter of the ceramic susceptor.

Embodiment 2

A ceramic susceptor that, apart from being printed with a pattern in which the outer peripheral edge of the resistive heating element domain was distorted by changing only the pattern of the tungsten resistive heating element, was the same as that of Embodiment 1 was manufactured. Fluctuation in the pullback length between the resistive heating element domain outer-peripheral edge, and the sintered AlN body outer peripheral edge was measured in the same manner as with Embodiment 1, with regard to obtained ceramic susceptors of three kinds; and the isothermal rating of the wafer-retaining face was also measured.

Results were that when the fluctuation in pullback length was ±0.007% with respect to the diameter of the ceramic susceptor, the isothermal rating of the wafer-retaining face was 500° C.±0.50%. Likewise, when the fluctuation in pullback length was ±0.010%, the isothermal rating was 500° C.±0.70%. And further, when the fluctuation in pullback length was ±0.011%, the isothermal rating was 500° C.±0.95%.

Embodiment 3

A granulated powder was prepared by adding 0.8 weight % boron carbide ($B_4C$) as a sintering promoter and polyvinyl alcohol as a binder to silicon carbide (SiC) powder, dispersing and mixing these ingredients using a ball mill with ethanol as a solvent, and then spray-drying the mixture to granulate it.

After being sintered the granulated powder obtained was molded with a uniaxial press into 2 plates whose dimensions were 355 mm diameter×5 mm thickness. These were degreased within a nitrogen gas stream at a temperature of 900° C. and then sintered 5 hours at 1950° C., whereby sintered SiC plates were manufactured. The thermal conductivity of the sintered SiC plates was 180 W/mK. Both the top and bottom surfaces of the obtained sintered SiC plates were polished using diamond grit.

Formation of a tungsten resistive-heating-element circuit and bonding of the two sintered plates was carried out by the same techniques as with Embodiment 1; and the same evaluation as with Embodiment 1 was conducted on the ceramic susceptor obtained, wherein the fluctuation in the pullback length was ±0.004% with respect to the diameter of the ceramic susceptor, while the isothermal rating of the wafer-retaining face was 500° C.±0.46%.

Embodiment 4

A granulated powder was prepared by adding 2 weight % yttria and 1 weight % alumina as sintering promoters and polyvinyl alcohol as a binder to silicon nitride ($Si_3N_4$) powder, dispersing and mixing these ingredients using a ball mill with ethanol as a solvent, and then spray-drying the mixture to granulate it.

After being sintered the granulated powder obtained was molded with a uniaxial press into 2 plates whose dimensions were 355 mm diameter×5 mm thickness. These were degreased within a nitrogen gas stream at a temperature of 900° C. and then sintered 4 hours at 1600° C., whereby sintered $Si_3N_4$ plates were manufactured. The thermal conductivity of the sintered $Si_3N_4$ plates was 22 W/mK. Both the top and bottom surfaces of the obtained sintered $Si_3N_4$ plates were polished using diamond grit.

Further, 1 weight % yttrium was added to tungsten powder, which with ethyl-cellulose added as a binder was kneaded into a mixture that was printed in a coil-shaped pattern onto one of the sintered $Si_3N_4$ plates. The printed $Si_3N_4$ plate was degreased in a 900° C. nitrogen gas stream, and then baked 1 hour at 1500° C. The final pullback length of the outer peripheral edge of the tungsten-pattern and the outer peripheral edge of the sintered $Si_3N_4$ plate was set herein to be 5.0 mm.

Further, ethyl-cellulose was added to, mixed with, and kneaded into a low-melting-point glass bonding material, which mixture was printed as pattern on the one further sintered $Si_3N_4$ plate. This was degreased within a 700° C. atmospheric air stream, and then the tungsten-pattern face and bonding-material face of the two sintered $Si_3N_4$ plates were matched and hot-press bonded under 10 $g/cm^2$ at 800° C. The outer periphery of the joined body was thereafter processed to finish it into a round contour 350 mm in diameter.

The same evaluation as with Embodiment 1 was conducted on the ceramic susceptor obtained, wherein the fluctuation in the pullback length was ±0.015% with respect to the diameter of the ceramic susceptor, while the isothermal rating of the wafer-retaining face was 500° C.±0.45%.

Embodiment 5

A powder prepared by adding to, and dispersing into and mixing together with, aluminum oxide ($Al_2O_3$) powder 1 weight % magnesia (MgO) as a sintering promoter and polyvinyl alcohol as a binder, and drying the mixture, was molded with a uniaxial press into 2 plates whose post-sintering dimensions were 355 mm diameter×5 mm thickness.

These were degreased within an atmospheric air stream at a temperature of 700° C. and then sintered 3 hours at 1600° C., whereby sintered plates were produced. The thermal conductivity of the $Al_2O_3$ plates was 20 W/mK. Both the top and bottom surfaces of the obtained sintered $Al_2O_3$ plates were polished using diamond grit.

Formation of a tungsten resistive-heating-element circuit and bonding of the two sintered plates was carried out by the same techniques as with Embodiment 4; and the same evaluation as with Embodiment 1 was conducted on the ceramic susceptor obtained, wherein the fluctuation in the pullback length was ±0.015% with respect to the diameter of the ceramic susceptor, while the isothermal rating of the wafer-retaining face was 500° C.±0.46%.

Embodiment 6

By a technique that, apart from a paste for forming the resistive-heating-element circuit being rendered by adding 1 weight % yttria to molybdenum powder and to this mixing in by kneading ethyl-cellulose as a binder, was the same as that of Embodiment 1, a joined body from sintered AlN plates was fabricated, and in the same manner thereafter a ceramic susceptor was manufactured.

The same evaluation as with Embodiment 1 was conducted on the ceramic susceptor obtained, wherein the fluctuation in the pullback length between the outer-peripheral edge of the molybdenum resistive heating element domain, and the outer peripheral edge of the sintered AlN body was ±0.015% with respect to the diameter of the ceramic susceptor, while the isothermal rating of the wafer-retaining face was 500° C.±0.46%.

Embodiment 7

Two sintered aluminum nitride plates were produced by the same method as with Embodiment 1. Utilizing a paste in which a sintering promoter and as a binder ethyl-cellulose were added and knead-mixed into Ag—Pd powder, a circuit was formed on one of the plates, which was baked in air at 900° C. The same method as with Embodiment 4 was utilized for a way of joining these with one further sintered-aluminum-nitride plate.

The same evaluation as with Embodiment 1 was conducted on the ceramic susceptor obtained, wherein the fluctuation in the pullback length between the outer-peripheral edge of the Ag—Pd resistive heating element domain, and the outer peripheral edge of the sintered AlN body was ±0.015% with respect to the diameter of the ceramic susceptor, while the isothermal rating of the wafer-retaining face was 500° C.±0.45.

Embodiment 8

Two sintered aluminum nitride plates were produced by the same method as with Embodiment 1. Utilizing a paste in which a sintering promoter and as a binder ethyl-cellulose were added and knead-mixed into Ni—Cr powder, a circuit was formed on one of the plates, which was baked in air at 700° C. The same method as with Embodiment 4 was utilized for a way of joining these with one further sintered-aluminum-nitride plate.

The same evaluation as with Embodiment 1 was conducted on the ceramic susceptor obtained, wherein the fluctuation in the pullback length between the outer-peripheral edge of the Ni—Cr resistive heating element domain, and the outer peripheral edge of the sintered AlN body was ±0.015% with respect to the diameter of the ceramic susceptor, while the isothermal rating of the wafer-retaining face was 500° C.±0.46.

Embodiment 9

A substrate onto which was baked a tungsten resistive heating element was produced by the same method as with Embodiment 1. Onto this resistive heating element was spread 100 μm of a paste in which $Y_2O_3$ and ethyl-cellulose binder were knead-mixed into aluminum nitride powder. This was degreased within nitrogen at 900° C. baked 2 hours at 1800° C.

The same evaluation as with Embodiment 1 was conducted on the ceramic susceptor obtained, wherein the fluctuation in the pullback length between the outer-peripheral edge of the tungsten resistive heating element domain, and the outer peripheral edge of the sintered AlN body was ±0.010% with respect to the diameter of the ceramic susceptor, while the isothermal rating of the wafer-retaining face was 500° C.±0.40.

COMPARATIVE EXAMPLE

Two molded aluminum nitride plates were fabricated by the same method as with Embodiment 1. One plate was spread with the same tungsten paste as in Embodiment 1, while the one other plate was spread with the same bonding-material paste[3] as in Embodiment 1. The two plates were stacked matching the tungsten-paste face with the bonding-material-paste face, and while 50 $kgf/cm^2$ pressure was applied were simultaneously baked at 1850° C.

The same evaluation as with Embodiment 1 was conducted on the ceramic susceptor obtained, wherein isothermal rating in the wafer-retaining face was 500° C.±1.30%. Further, the ceramic susceptor was breached along the radial direction and fluctuation in the pullback length between the outer-peripheral edge of the tungsten resistive heating element domain, and the outer peripheral edge of the sintered AlN body was measured, wherein it was ±1.2% with respect to the diameter of the ceramic susceptor.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A ceramic susceptor, comprising:
   first and second plate-shaped sintered ceramic body portions, the first and second body portions hot-press bonded together to form a plate-shaped body having an outer peripheral edge;
   a printed resistive heating element formed on a face of one of the sintered ceramic body portions; wherein
   the resistive heating element is printed, and the sintered body portions are hot-press joined, such that (i) the heating element is in the plate-shaped body, and (ii) a peripheral fluctuation in pullback length between the outer peripheral edge of the plate-shaped body and an outer peripheral edge of the heating element is within ±0.8%, said ±0.8% being with respect to an outer diameter of the ceramic body.

2. The ceramic susceptor set forth in claim 1, wherein fluctuation in said pullback length is within ±0.5%.

3. The ceramic susceptor set forth in claim 2, wherein said sintered ceramic body is made of at least one substance type selected from aluminum nitride, silicon nitride, silicon carbide, and aluminum oxide.

4. The ceramic susceptor set forth in claim 3, wherein said resistive heating element is made of at least one metal type selected from W, Mo, Ag, Pt, Pd, Ni and Cr.

5. The ceramic susceptor set forth in claim 2, wherein said resistive heating element is made of at least one metal type selected from W, Mo, Ag, Pt, Pd, Ni and Cr.

6. The ceramic susceptor set forth in claim 1, wherein said sintered ceramic body is made of at least one substance type selected from aluminum nitride, silicon nitride, silicon carbide, and aluminum oxide.

7. The ceramic susceptor set forth in claim 6, wherein said resistive heating element is made of at least one metal type selected from W, Mo, Ag, Pt, Pd, Ni and Cr.

8. The ceramic susceptor set forth in claim 1, wherein said resistive heating element is made of at least one metal type selected from W, Mo, Ag, Pt, Pd, Ni and Cr.

* * * * *